(12) United States Patent
Padmanabhan et al.

(10) Patent No.: US 9,397,154 B2
(45) Date of Patent: Jul. 19, 2016

(54) TERMINATION DESIGN BY METAL STRAPPING GUARD RING TRENCHES SHORTED TO A BODY REGION TO SHRINK TERMINATION AREA

(71) Applicant: Alpha and Omega Semiconductor Incorporated, Sunnyvale, CA (US)

(72) Inventors: Karthik Padmanabhan, San Jose, CA (US); Madhur Bobde, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/841,687

(22) Filed: Aug. 31, 2015

(65) Prior Publication Data

US 2016/0099307 A1 Apr. 7, 2016

Related U.S. Application Data

(63) Continuation of application No. 14/098,538, filed on Dec. 6, 2013, now Pat. No. 9,153,653.

(51) Int. Cl.

| H01L 29/00 | (2006.01) |
|---|---|
| H01L 29/06 | (2006.01) |
| H01L 29/78 | (2006.01) |
| H01L 29/40 | (2006.01) |
| H01L 29/10 | (2006.01) |
| H01L 29/08 | (2006.01) |

(52) U.S. Cl.
CPC ........ *H01L 29/0623* (2013.01); *H01L 29/0878* (2013.01); *H01L 29/1095* (2013.01); *H01L 29/407* (2013.01); *H01L 29/7811* (2013.01)

(58) Field of Classification Search
CPC ............ H01L 29/0623; H01L 29/1095; H01L 29/0878; H01L 29/04; H01L 29/7811
See application file for complete search history.

(56) References Cited

U.S. PATENT DOCUMENTS

| 5,859,466 | A  * | 1/1999  | Wada   | H01L 21/765 |
|---|---|---|---|---|
|           |      |         |        | 275/508 |
| 6,274,919 | B1 * | 8/2001  | Wada   | H01L 21/765 |
|           |      |         |        | 257/508 |
| 8,680,611 | B2 * | 3/2014  | Kocon  | H01L 29/7827 |
|           |      |         |        | 257/330 |
| 8,753,935 | B1 * | 6/2014  | Bobde  | H01L 29/66719 |
|           |      |         |        | 257/334 |
| 8,779,510 | B2 * | 7/2014  | Yilmaz | H01L 29/4236 |
|           |      |         |        | 257/334 |
| 9,064,897 | B2 * | 6/2015  | Guan   | H01L 29/407 |
| 2011/0291186 | A1 * | 12/2011 | Yilmaz | H01L 29/4236 |
|           |      |         |        | 257/334 |
| 2012/0319197 | A1 * | 12/2012 | Kocon  | H01L 29/7827 |
|           |      |         |        | 257/331 |
| 2014/0027840 | A1 * | 1/2014  | Guan   | H01L 29/407 |
|           |      |         |        | 257/330 |

* cited by examiner

*Primary Examiner* — Nikolay Yushin
(74) *Attorney, Agent, or Firm* — Bo-In Lin

(57) ABSTRACT

This invention discloses a semiconductor power device formed in a semiconductor substrate of a first conductivity type comprises an active cell area and a termination area surrounding the active cell area and disposed near edges of the semiconductor substrate. The termination area includes a plurality of trenches filled with a conductivity material forming a shield electrode and insulated by a dielectric layer along trench sidewalls and trench bottom surface wherein the trenches extending vertically through a body region of a second conductivity type near a top surface of the semiconductor substrate and further extending through a surface shield region of the first conductivity type. A dopant region of the second conductivity type disposed below the surface shield region extending across and surrounding a trench bottom portion of the trenches. At least a metal connector disposed above the top surface of the semiconductor substrates electrically connecting to the shield electrode of at least two trenches and shorted to the body region.

20 Claims, 16 Drawing Sheets

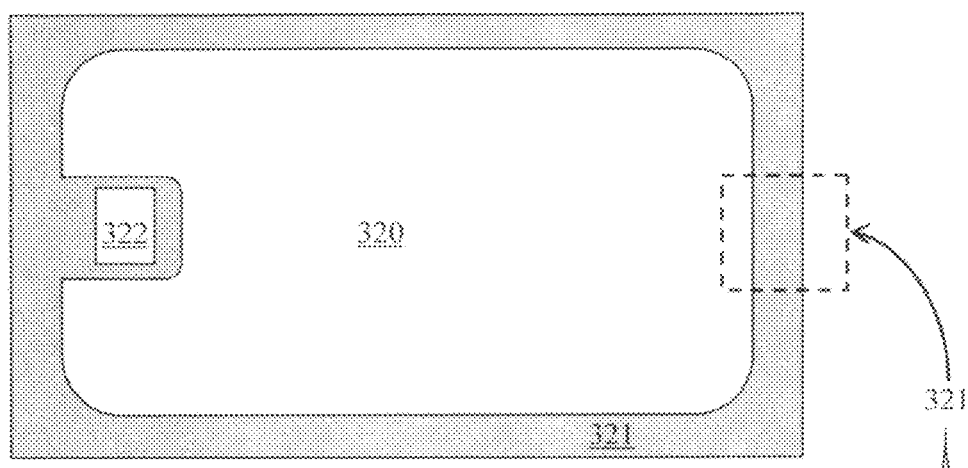
FIG. 3A
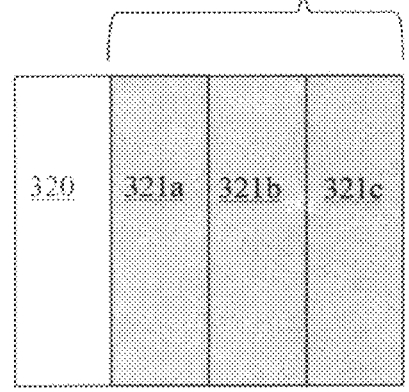

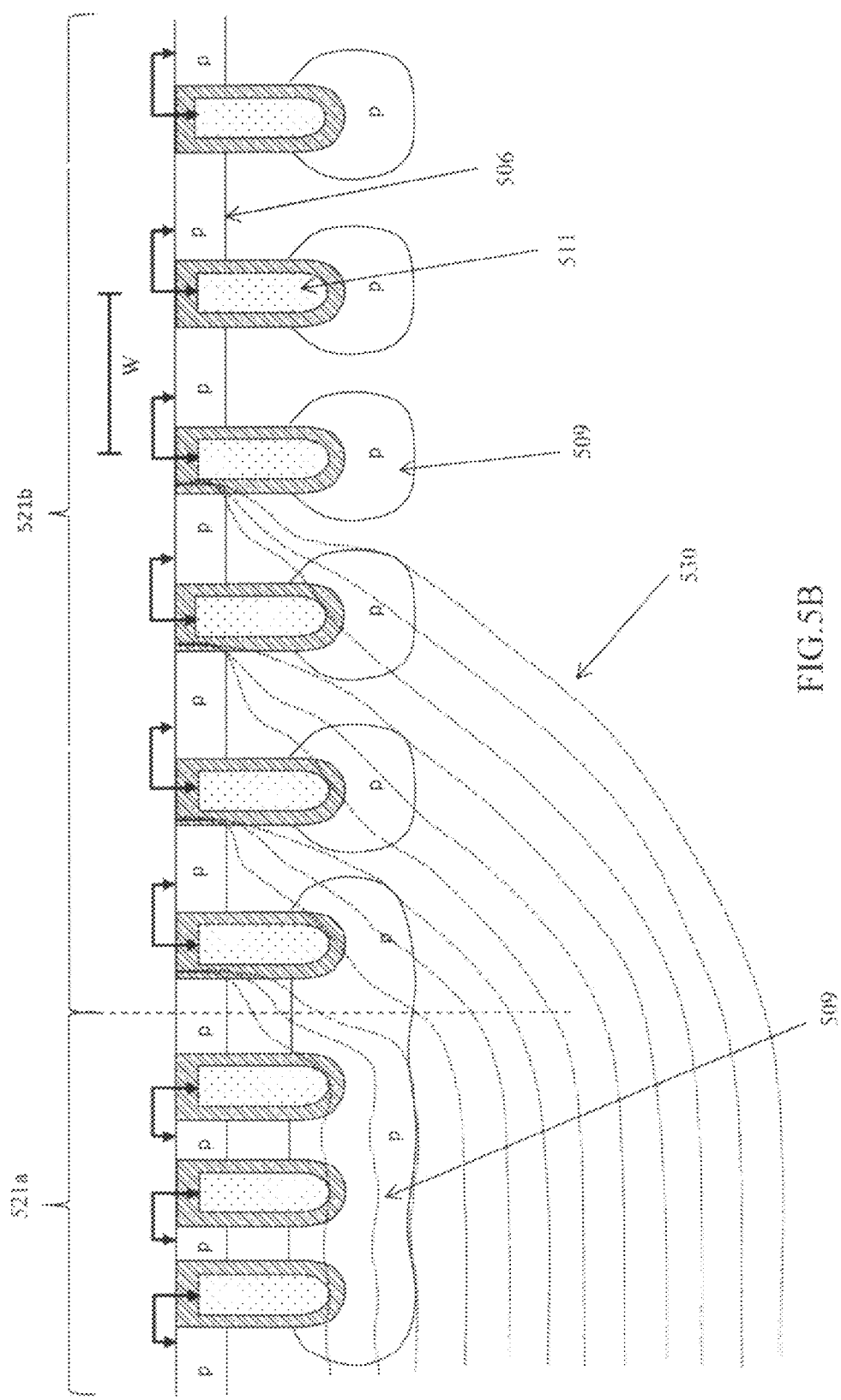

TERMINATION DESIGN BY METAL STRAPPING GUARD RING TRENCHES SHORTED TO A BODY REGION TO SHRINK TERMINATION AREA

CROSS-REFERENCE TO RELATED APPLICATION

This application is a Continuation application and claims the Priority Date of a co-pending patent application Ser. No. 14/098,438 filed on Dec. 6, 2013 by common inventors of this application. The disclosures of application Ser. No. 14/098, 538 are hereby incorporated by reference.

1. Field of the Invention

The invention relates generally to semiconductor power devices. More particularly, this invention relates to new configurations and methods for manufacturing improved power device structures for field balance metal oxide field effect transistors (FBMS).

2. Description of the Related Art

Conventional technologies to configure and manufacture high voltage semiconductor power devices are still confronted with difficulties and limitations to further improve the performances due to different tradeoffs. In the vertical semiconductor power devices, there is a tradeoff between the drain to source resistance, i.e., on-state resistance, commonly represented by RdsA (i.e., Rds X Active Area) as a performance characteristic, and the breakdown voltage sustainable of the power device. A commonly recognized relationship between the breakdown voltage (BV) and the RdsA is expressed as: RdsA is directly proportional to $(BV)^{2.5}$. For the purpose of reducing the RdsA, an epitaxial layer is formed with higher dopant concentration. However, a heavily doped epitaxial layer also reduces the breakdown voltage sustainable by the semiconductor power device.

Several device configurations have been explored in order to resolve the difficulties and limitations caused by these performance tradeoffs. FIG. 1A shows the cross section of a conventional floating island and thick bottom trench oxide metal oxide semiconductor (FITMOS) field effect transistor (FET) implemented with thick bottom oxide in the trench gate and floating P-dopant islands under the trench gate to improve the electrical field shape. The charge compensation of the P-dopant in the floating islands enables the increasing the N-epitaxial doping concentration, thus reduce the RdsA. In addition, the thick bottom oxide in the trench gate lowers the gate to drain coupling, thus lower the gate to drain charge Qgd. The device further has the advantage to support a higher breakdown voltage on both the top epitaxial layer and the lower layer near the floating islands. However, the presence of floating P region causes higher dynamic on resistance during switching.

In U.S. Pat. No. 5,637,898, Baliga discloses a power transistor with a specific goal of providing a high breakdown voltage and low on-state resistance. The power transistor as that shown in FIG. 1B is a vertical field effect transistor in a semiconductor substrate that includes trench having a bottom in the drift region as insulated gate electrode for modulating the conductivity of the channel and drift regions in response to the application of a turn-on gate bias. The insulated gate electrode includes an electrically conductive gate in the trench and an insulating region which lines a sidewall of the trench adjacent the channel and drift regions. The insulating region has a non-uniform cross-sectional area between the trench sidewall and the gate which enhances the forward voltage blocking capability of the transistor by inhibiting the occurrence of high electric field crowding at the bottom of the trench. The thickness of the insulating region is greater along the portion of the sidewall which extends adjacent the drift region and less along the portion of the sidewall which extends adjacent the channel region. The drift region is also non-uniformly doped to have a linearly graded doping profile that decreases in a direction from the drain region to the channel region to provide low on-state resistance. The charge compensation in this device is achieved by the gate electrode. However, the presence of a large gate electrode significantly increases the gate to drain capacitance of this structure, resulting in higher switching losses. In addition, it presents the additional manufacturing complexity of having a linearly graded doping in the drift region.

In U.S. Pat. No. 7,335,944, Banerjee et al. disclose a transistor as that shown in FIG. 1C includes first and second trenches defining a mesa in a semiconductor substrate. First and second field plate members are respectively disposed in the first and second trenches, with each of the first and second field plate members separated from the mesa by a dielectric layer. The mesa includes a plurality of sections, each section having a substantially constant doping concentration gradient, the gradient of one section being at least 10% greater than the gradient of another section, i.e., the doping profile gradient in the drift region varies as a function of the vertical depth of the drift region. Each field plate is electrically connected to the source electrode. In this device, the charge compensation is achieved by the field plate connected to the source. However, the manufacturing of this structure requires complex fabrication processes that include deep trenches and thick liner oxide.

For the above reasons, there is a need to provide new device configurations and new manufacturing methods for the semiconductor power devices reduce the on-state resistance and in the meantime increasing the breakdown voltage sustainable by the power device such that the above discussed difficulties and limitations can be resolved.

SUMMARY OF THE PRESENT INVENTION

It is an aspect of the present invention to provide a new and improved device configuration and manufacturing method for providing a semiconductor power device with reduced RdsA while maintaining high breakdown voltage, especially provide high breakdown voltage in the termination area while reducing the size of the termination area.

Another aspect of the present invention is to provide a new and improved device configuration and manufacturing method for providing a semiconductor power device that implements a metal strapping configuration in a first termination zone of the termination area by strapping and shorting two or more adjacent trenches to P-body regions creating electric dead zones that increase the rate of voltage reduction in the first termination zone, thus enabling a reduction of the termination area without sacrificing the value of the breakdown voltage.

Briefly in a preferred embodiment this invention discloses a semiconductor power device formed on a semiconductor substrate of a first conductivity type comprises an active cell area and a termination area surrounding the active cell area and disposed near edges of the semiconductor substrate. The termination area includes a plurality of trenches filled with a conductivity material and insulated by a dielectric layer along trench sidewalls and trench bottom surface wherein the trenches extending vertically through a body region of a second conductivity type near a top surface of the semiconductor substrate and further extending through a surface shield region of the first conductivity type. A dopant region of the second conductivity type disposed at the bottom portion of the surface shield region extending across and surrounding a trench bottom portion of the trenches. At least two metal connectors disposed above the top surface of the semiconductor substrates wherein each of the metal connectors electrically shorting at least two adjacent trenches to a body region creating a dead zone.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 3A is a top view of a device die showing the active area and the termination region according to a first embodiment of the present invention.

FIG. 5B is a cross section view of the termination region that depicts the electric potential contours of a second embodiment of the present invention.

DETAILED DESCRIPTION OF THE PREFERRED EMBODIMENTS

Figure 1A:
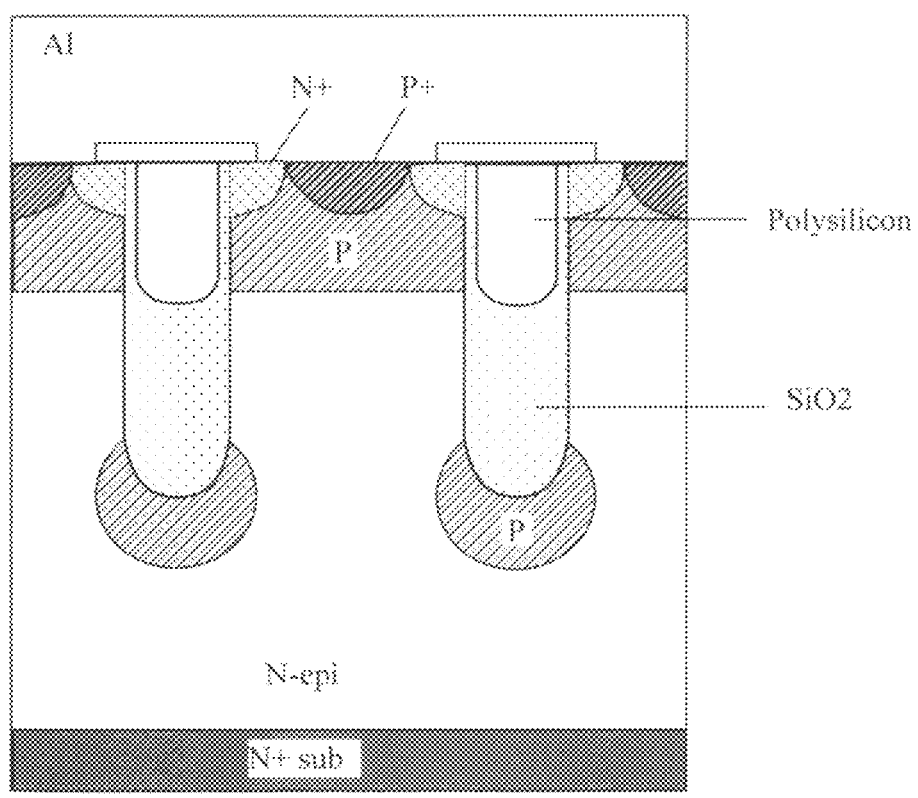
FIGS. 1A to 1C are cross sectional views showing three different configurations of conventional semiconductor power devices.
Figure 1B:
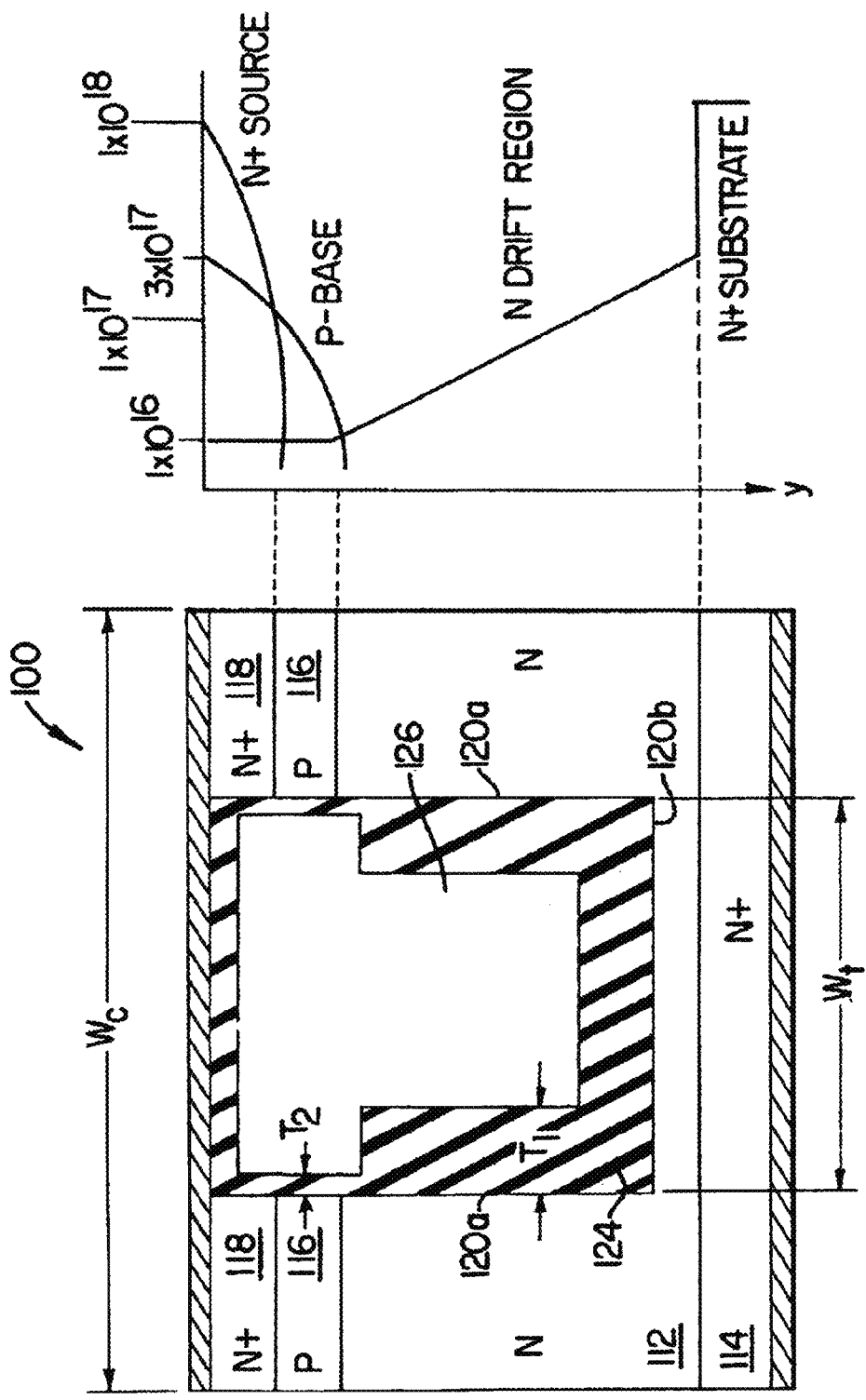
Figure 1C:
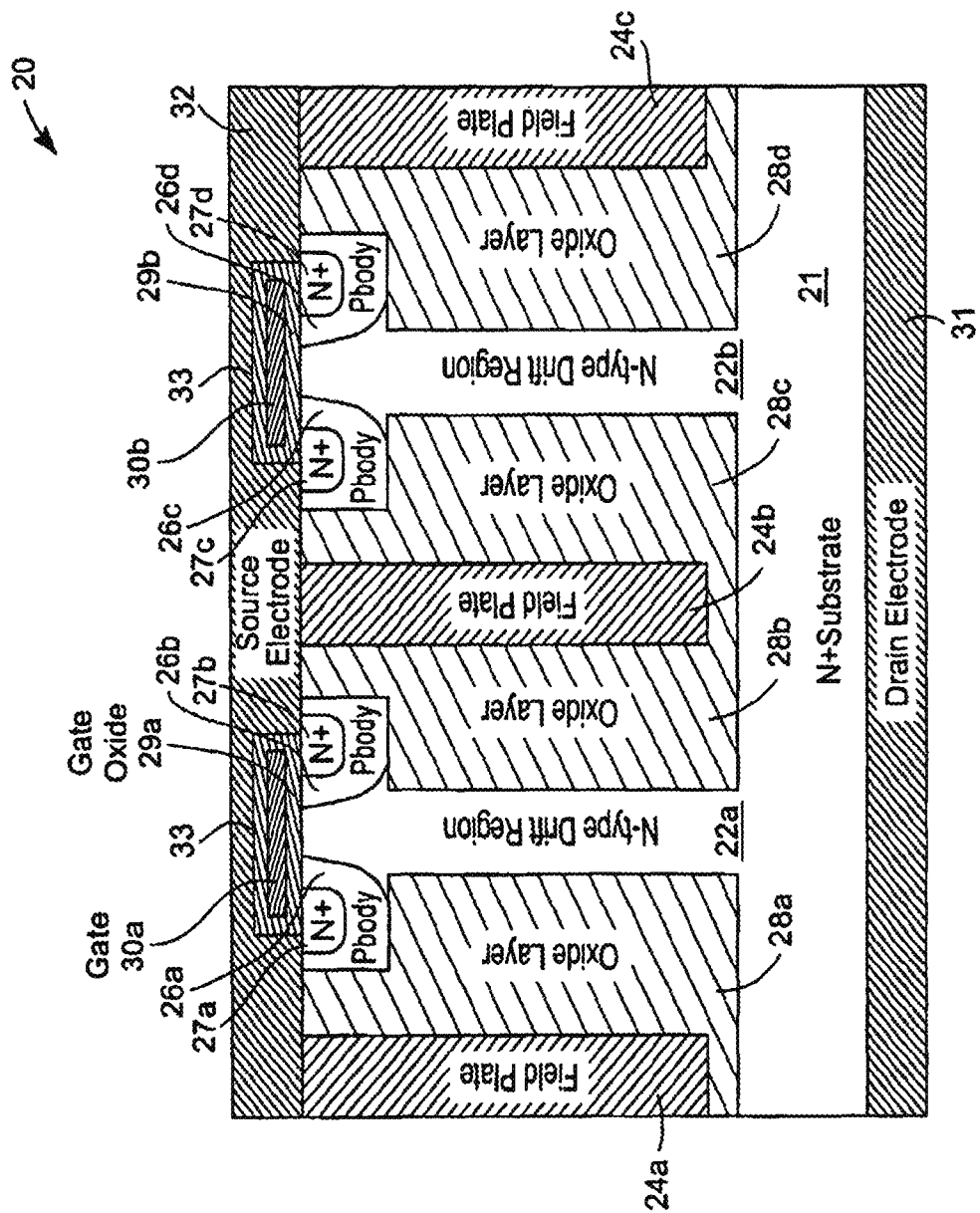
Figure 1D:
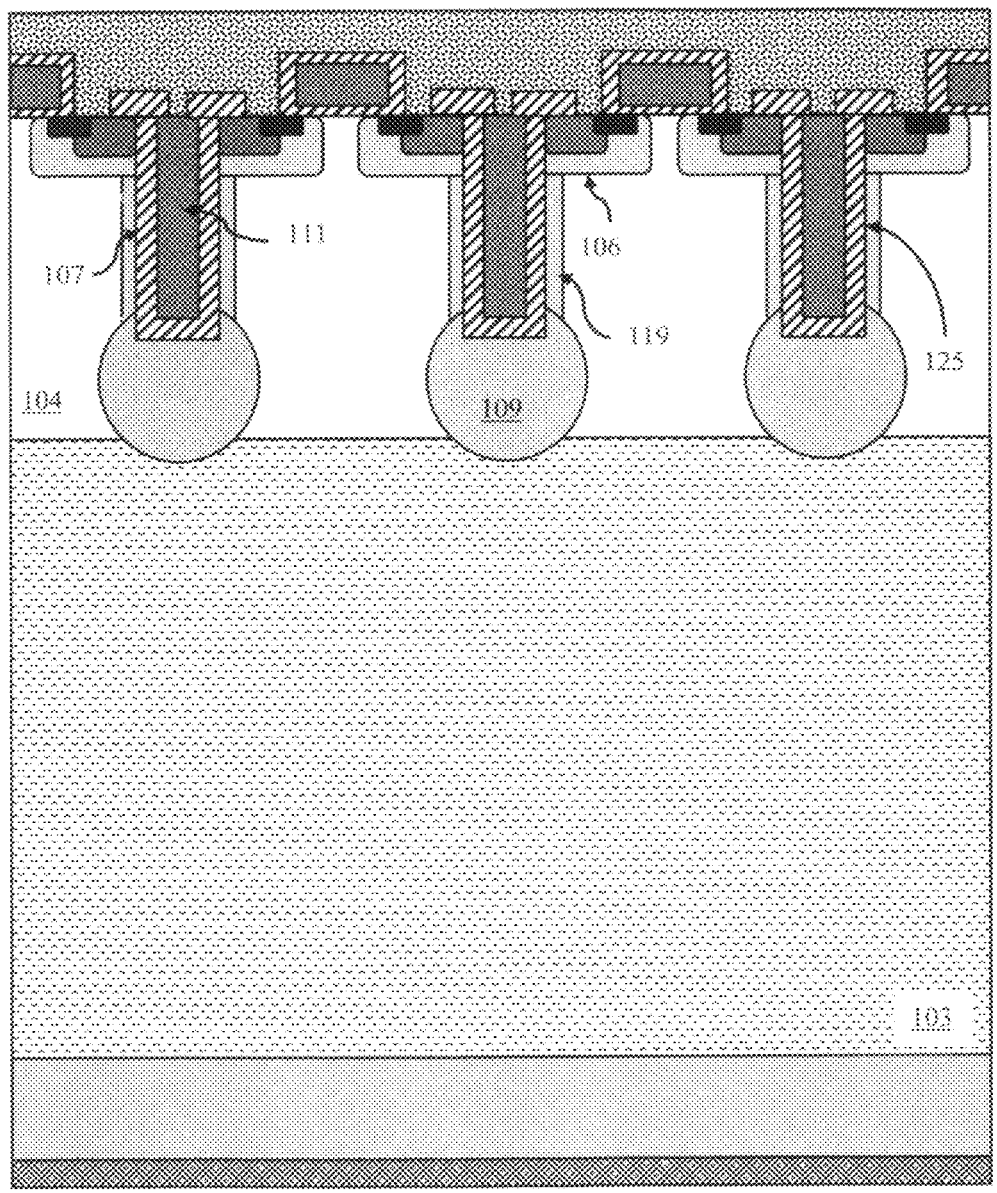
FIG. 1D is a diagram of a Field Balance MOSFET (FBM) device.

As disclosed in application Ser. No. 13/561,300 and now incorporated in this application by reference, FIG. 1D shows an improved device configuration of a field balance metal oxide field effect transistor (FBM) 100 wherein the BV of FBM 100 is significantly increased with only minimal increase of $R_{dsA}$. Specifically, in the FBM device 100, the BV is split between a surface shielded region 104 and a voltage blocking region 103. In an exemplary embodiment, the FBM device has a BV of 660 V and wherein the surface shielded region 104 supports 140 V and the voltage blocking region 103 supports a voltage of 520 V. The voltage blocking region 103 functions as a traditional epitaxial (epi-) layer and performs according to the functional relationship of RdsA proportional to $(BV)^{2.5}$ therefore the proportional decrease in RdsA of the device as a result of decreasing the voltage supported by the voltage blocking region 103 from 660 V to 520 V by s ratio of $(660/520)^{2.5}=1.81$. For example, if the $R_{dsA}$ of a device was originally 82 m $\Omega$km$^2$ for an epi-layer that must support the entire 660 V, then for a voltage blocking region 103 that only needs to support 520 V, the reduced $R_{dsA}$ would be only 45.2 m$\Omega$cm$^2$.

Even though it is advantageous to configure the surface shielded region 104 to support the remaining voltage, while only adding a negligible amount of resistance, however, in order to accomplish this, it is required to make the surface shielded region 104 as highly doped region in order to maintain a low $R_{dsA}$. With a high doping concentration, the epi-layer alone cannot support enough voltage. Therefore, the surface shielded region 104 needs to be charge compensated. The charge compensation is provided by two separate components: (1) a MOS capacitor created by the oxide 107 surrounding the shield electrode 111; and (2) the buried P-region 109. Both components can be configured such that they each support the desired amount of the voltage. In an exemplary embodiment, the voltage supported by the surface shielded region 104 may be half supported by the buried P-region 109 and half supported by the oxide 107. More details are disclosed in a commonly assigned patent application Ser. No. 13/561,523 (attorney reference number ANO-056-US), which was incorporated herein by reference above.

Compared with a conventional MOSFET device, even though the FBM device as discussed above can allow for a higher breakdown voltage BV without significantly increasing $R_{dsA}$ than a conventional MOSFET device, the FBM structure still confronts with a technical problem due to the facts that the FBM structure does not prevent the reduction of BV at localized spots. Particularly, the BV at the edge of a device die is typically much lower than the BV supported by the drift layer. In another commonly assigned patent application, disclosures are made related to new termination structures that are implemented to reduce the peak electric field at the edges of the device in order to decrease the effects of localized breakdown.

Figure 2A:
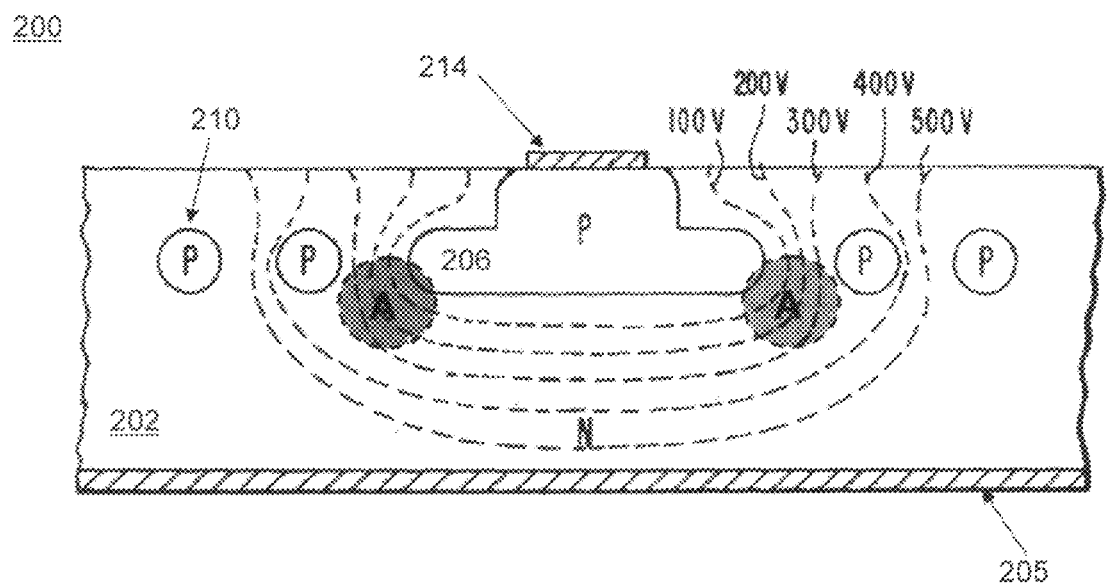
FIG. 2A is a diagram of a prior art buried guard ring termination structure.

A conventional method for configuring a termination structure is depicted in FIG. 2A by implementing a buried guard ring for a P-N junction device 200. The junction is formed by forming an N-doped semiconductor substrate 202 in contact with a P-doped region 206. The P-doped region 206 is connected to a source electrode 214 and the semiconductor substrate 202 is in electrical contact with the drain electrode 205. The addition of the P-doped guard rings 210 alleviates the electric field crowding at the P-N junction in the region labeled A.

The guard ring structure serves to reduce the amount of field crowding at the main P-N junction by spreading the depletion layer past consecutively higher potential floating junctions (rings). Each guard ring 210 becomes biased when the spreading depletion layer punches through to the floating junction. To remain in equilibrium, the ring's potential will follow that of the surrounding material to within the built-in potential of the junction.

Careful spacing is required to achieve the desired reduction in the electric field. If the guard rings 210 are spaced too close to the P-N junction then the most of the potential is transferred to the rings and the break down will occur at the junction in the substrate of the guard rings 210. Conversely, when the guard rings 210 are spaced too far away from the P-N junction, then not enough potential will be transferred to the rings and the breakdown will occur at the P-N junction. The guard rings 210 are buried within the substrate to ensure that the improvement in breakdown BV is not surface limited by excess surface charge. However, additional mask and epitaxial layer growth are needed in order to manufacture a buried guard ring structure.

Figure 2B:
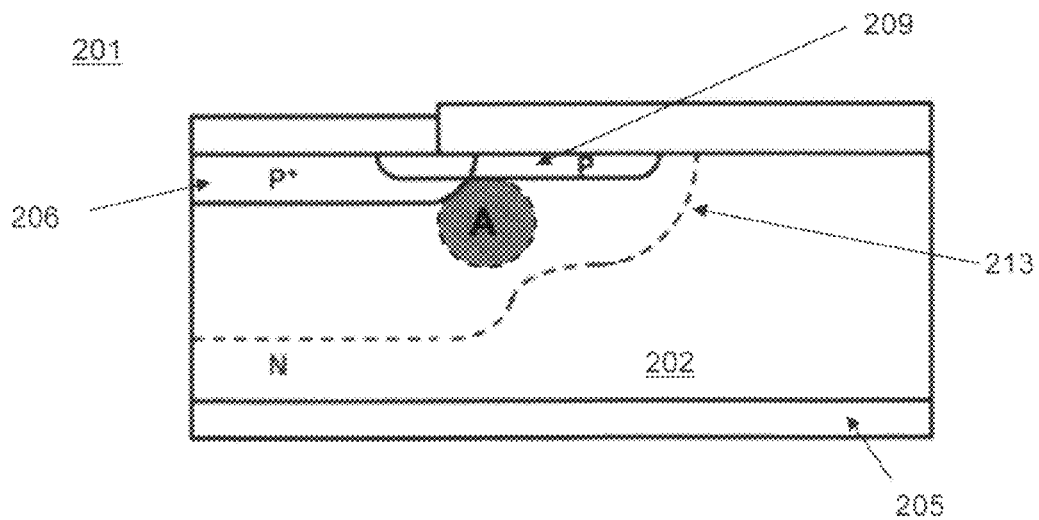
FIG. 2B is a diagram of a prior art junction termination extension termination structure.

FIG. 2B shows a junction termination extension (JTE) as another conventional method relieve electric field crowding at the P-N junction in the region labeled A. In a JTE the surface electric field at the edges of the device are altered by selectively adding charge to the junction. FIG. 2B depicts the basic structure of a device 201 that uses a prior-art JTE. The P-N junction is formed by an N-doped semiconductor substrate 202 being in contact with a P-doped region 206. The additional charge is added in the JTE region 209. The effectiveness of the JTE region 209 is determined by the amount of charge added (i.e., the doping concentration). If the concentration is too high, then the JTE will serve only to extend the P-N junction and the breakdown will occur at the far right end of the JTE region 209 without an increase in the BV. Alternatively, if the concentration of the JTE region 209 is too low, then there will be no beneficial effect and the breakdown will occur at the end of the P-doped region 206 with no increase in the BV. In order to reduce the electric field at the original P-N junction, the JTE region 209 must be designed such that the charge is completely depleted by the reverse bias. In FIG. 2B the depletion area is represented by dotted line 213. When JTE region 209 is completely depleted, the electric field will be spread out over the entire length of the JTE region 209 instead of being crowded at the original P-N junction. However, JTE structures are susceptible to surface mobile ionic charges. This issue reduces the effectiveness of the termination structure and leads to problems with achieving good reproducibility.

In order to overcome the above-discussed technical difficulties encountered in the conventional termination structures, the following descriptions of FIGS. 3A to 6B as that disclosed in a commonly owned patent application previously filed are included herein as introductory and background information below.

A first embodiment is directed to a termination structure for a semiconductor transistor device wherein the termination structure includes buried P-regions and each of the buried P-regions is connected to the P-body region. With the connection between the buried P-regions and the P-body region, a termination structure that includes three zones are presented.

FIG. 3A is a top view of a device die with a gate pad 322 and a termination region 321 disposed near a peripheral area of the device die surrounding an active cell area 320 formed with a plurality of active transistor cells. In an exemplary embodiment, the semiconductor power device may be an FBM device as shown in FIG. 1. The termination region 321 includes three zones as shown by a region surrounded by the dotted box. The termination region 321 is magnified to show these three zones 321a, 321b, and 321c. The narrow strip on the edge of the device die as shown is a representation of the outside perimeter of the device die. The first zone 321a is proximate to the active cell area 320 and surrounds the entire perimeter of the active cell area 320. The second zone 321b is formed immediately outside the first zone and surrounds 63 entire outer perimeter of the first zone 321a. The third zone 321c is formed immediately outside the second zone and surrounds the entire outer perimeter of the second zone 321b. The third zone 321c extends to the edge of the device die. The width of each zone is provided as one possible configuration. It should be noted that the designer is free to alter the respective widths of each zone to maximize the properties desired for the device.

As discussed above, the semiconductor power devices designed to withstand high voltage like the FBM device of FIG. 1 is limited by the lower BV present at the edges of the device. For this reason, it is critical to properly design the termination region 321 in order to increase the BV of the entire device. The three termination zones 321a, 321b, and 321c each have a specific role in maximizing the BV at the edge of the device.

Figure 3B:
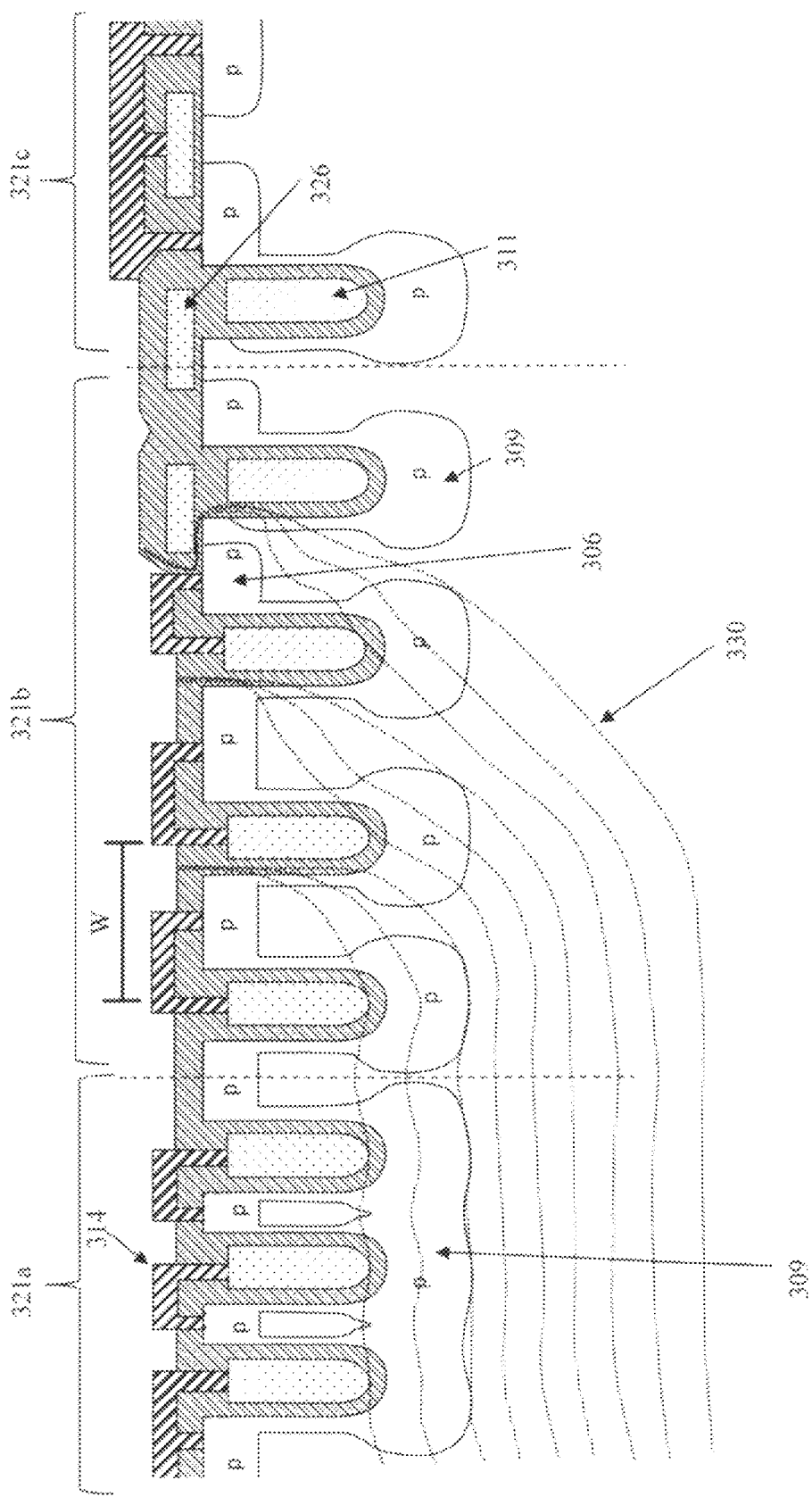
FIG. 3B is a cross section view of the termination region that depicts the electric potential contours of a first embodiment of the present invention.

FIG. 3B is a cross sectional view of the three regions of the termination area 321 with lines for illustrating the variation of the electric potential contours 330 in each of these three zone. In the first termination zone 321a the electric potential contours are mostly prevented from coming to the surface. The buried P-region 309 depletes and prevents the potential contours from advancing towards the surface of the device. The electric field is spread over the entire depleted area and as a result the first termination zone 321a is formed to achieve a function of spreading the electric field. More detail structures of these three zones are further described in the FIGS. 4A and 4B.

Figure 4A:
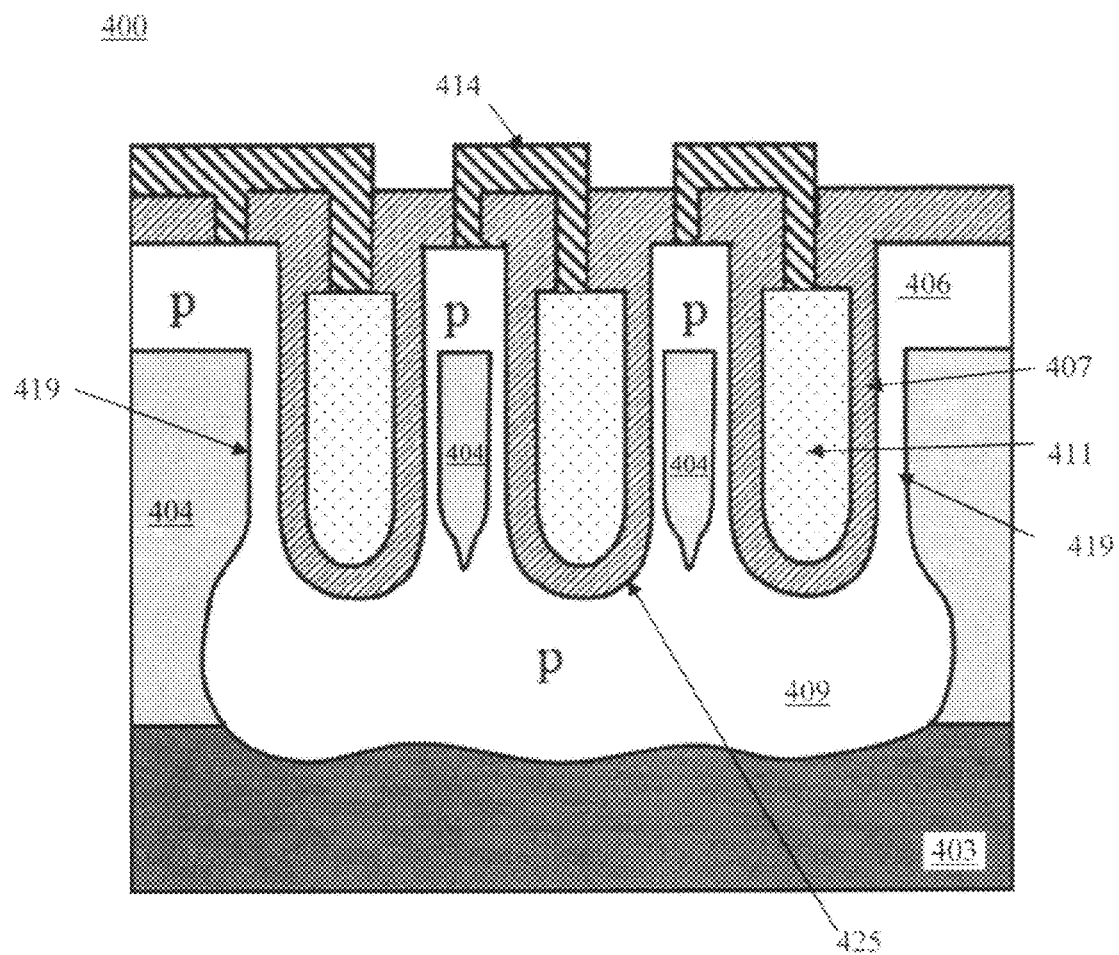
FIGS. 4A-4C are cross sectional views of the three different termination zones within the termination region according to a first embodiment of the present invention.

FIG. 4A is a cross section of the termination structures 400 to depict structural details of the first termination zone 321a. The first termination zone 321a is disposed near the edge of the active cell area to spread the electric field rapidly. The termination device structures 400 as shown for the first termination zone 321a are formed on a suitably doped (e.g., N-type) semiconductor substrate (not specifically shown) to support a voltage blocking region 403 above the substrate. FIG. 4A only shows a top portion of the voltage blocking region 403. A surface shielded region 404 is formed above the voltage blocking region 403. Both layers are suitably doped (e.g., N-type). The doping concentration of the surface shielded layer 404 is on the order of 5 to 100 times greater than the doping concentration of the blocking region 403. In an exemplary embodiment, the voltage blocking region 403 may have a doping concentration of about 1e14 cm$^3$ to 5e15 cm$^3$, and the surface shielded region 404 may have a doping concentration of about 1e15 cm$^3$ to 5e16 cm$^3$. These layers are formed at the same time the corresponding layers in the active cell area are formed and therefore require no additional processing steps.

The termination device structures 400 also include trenches 425 extending down through the surface shielded region 404. However, it should be noted that the depth of the shield trench is variable and can also extend into the voltage blocking region 403 in some embodiments. The trench is lined with a suitable dielectric material 407. By way of example and not by way of limitation the dielectric material may be a thermal oxide or a deposited oxide. The trenches 425 are filled with a conductive material to form a shield electrode 411. By way of example and not by way of limitation, the shield electrode may be formed with polysilicon. The shield trench and electrodes for the termination device structures may be formed during the same processing steps that are used to form the active device shield trenches and shield electrodes and therefore require no additional processing steps. Proximate to the shield electrode 411 at the top surface of the surface shielded region 404 a suitably doped (e.g., P-doped) body layer 406 is formed. The body layer 406 extends from the shield electrode 411 and continues until it reaches the next trench.

In order to quickly spread the electric field, electrical connection 414 connects the shield electrode 411 to a portion of the body layer 406 to its left. As shown in FIG. 4A, the body layer 406 to the left of a shield electrode 411 is closer to the active region. The spreading of the electric field is also achieved through the use of buried P-doped regions 409. Buried P-regions 409 are formed below each shield electrode 411. By way of example and not by way of limitation, the cumulative depth of the trench 425 plus the buried P-region 409 may extend deeper than or substantially the same depth surface shielded region 404.

As used herein, the term "substantially the same depth" means that the depth of the surface shielded region 404 is within ±10% of the cumulative depth of the trench 425 plus the buried P-region 409.

Forming the depleting region 409 below the surface of the device 400 provides an advantage over traditional JTE type termination structures. Using a buried P-region 409 will yield a higher overall BV because the BV will not be diminished by externally induced variations across the surface of the device. By way of example and not by way of limitation, the buried P-region 409 may be formed through ion implantation. The P-type dopants are implanted at the bottom of the trench before the dielectric material 407 and shield electrode 411 are formed in the trench. The buried P-regions 409 below each trench may become connected to the adjacent buried P-regions 409. Additionally, the buried P-region 409 nearest the active cell area 320 may be connected to the buried P-region 109 of an active device structure.

In the active cell area 320 the buried P-regions 109 create a P-N junction capacitor when it is not connected to the body layer 106. This creates problems with switching, because the presence of floating P-regions 109 causes higher dynamic on resistance during switching. Therefore, a P-link 119 between the buried P-region 109 and the upper body region 106 may b formed to create an electrical path for the buried P-regions 109 to discharge. According to one embodiment, the P-links 119 may be created with a blanket tilt implant in order to minimize masking steps. The blanket implant also creates P-links 419 between the buried regions 409 in the termination zones and the body layer 406.

Once the electric field has been spread it must then be brought back to the surface quickly and in a uniform manner. FIG. 3B shows that in the second termination zone 321*b* the electric field is allowed to move back to the surface by allowing the potential contours 330 to form in between the vertical walls of the shield electrodes 311.

Figure 4B:
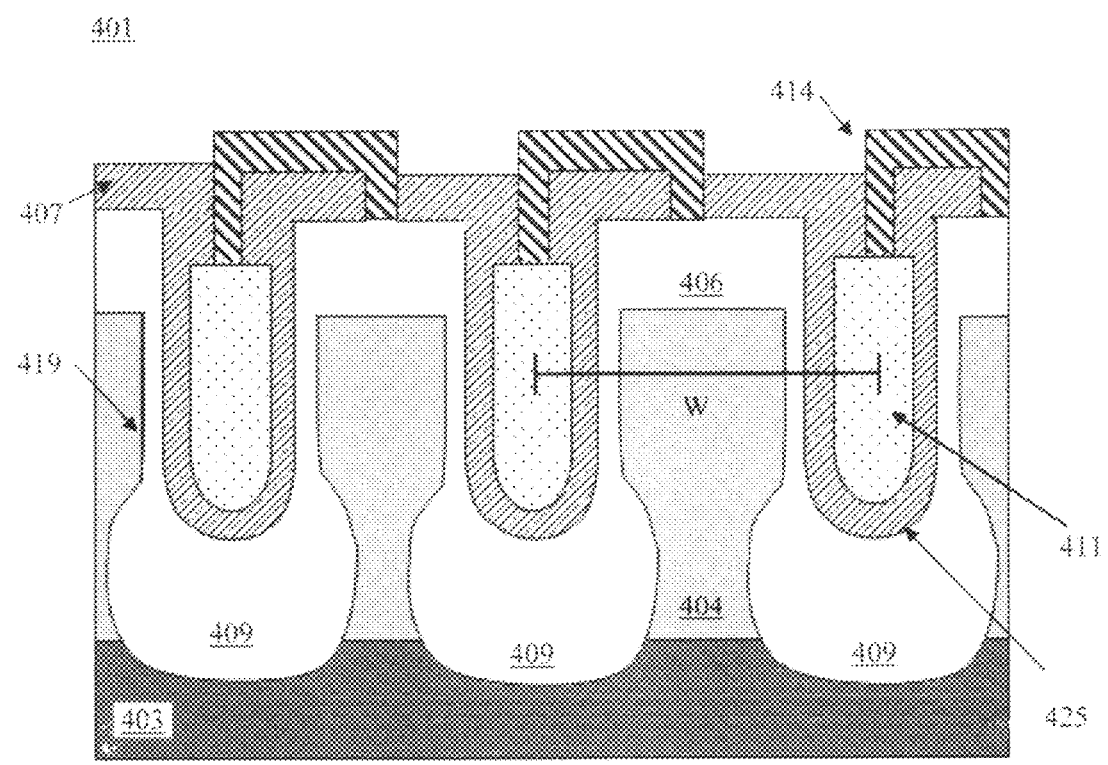

FIG. 4B depicts the termination structures 401 in the second termination zone 321*b*. These termination structures in the second zone 401 are formed in a similar manner to those in termination zone one. In the present embodiment there are only two differences. First, electrical connector 414 connects the shield electrode 411 to the body layer 406 immediately following the shield electrode 411. As shown in FIG. 4B, the body layer 406 immediately following the shield electrode 411 is the one immediately to the right of the trench and further away from the active area. Second, the spacing between the trenches W increases as the structures' 401 distance from the active cell area increases. Within the second termination zone, the buried P-regions 409 are in electrical connection with the buried P-regions 409 of the first termination zone through their connection to the body layer 406.

Once the electric field is brought to the surface, the third termination zone 321*c* is needed in order to prevent a short circuit to the edge of the device. As shown in FIG. 3B, surface poly regions 326 serve as a field plate and interrupt the body layer 306. This prevents a short circuit from forming between the body layer and the edge of the device. The surface poly regions 326 are floating and therefore are not connected to the gate potential. As shown, the body layer 306 is no longer connected to adjacent conducting regions in the third termination zone 321*c*.

Figure 4C:
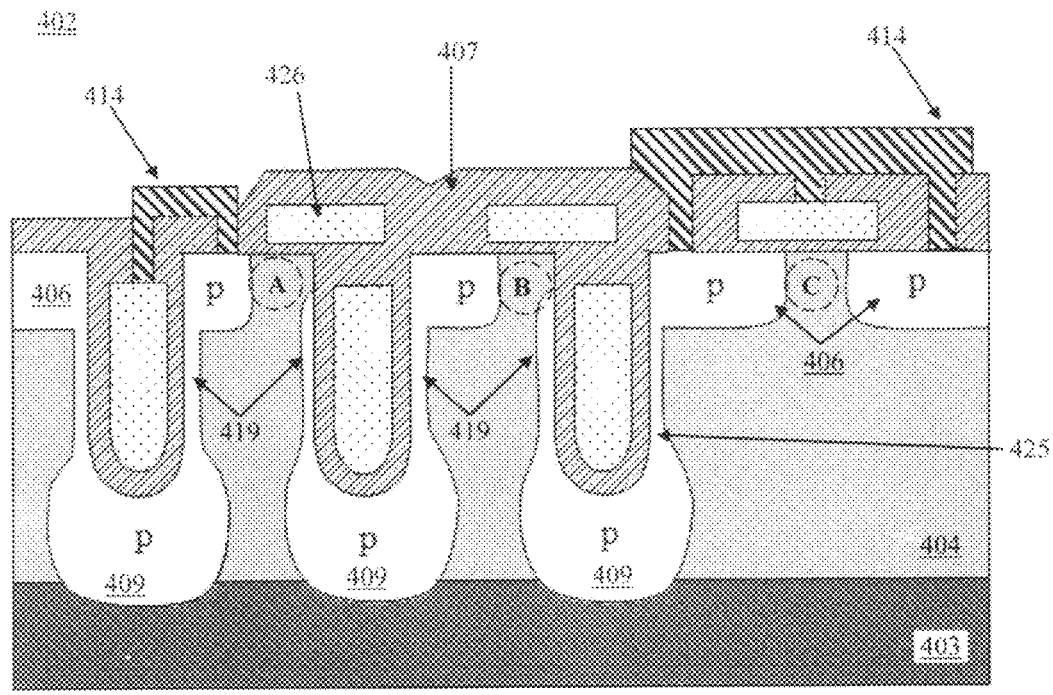

FIG. 4C shows the structure of the third termination zone 321*c* and illustrates how it acts as a channel stop. The termination structures 402 in the third termination zone 321*c* are formed in a similar manner to those in the previous termination zones. In the present embodiment the difference in the third termination zone 321*c* is that floating surface poly regions 426 are formed above the surface shielded region 404. As a result the body region 406 is prevented from forming underneath the surface poly regions 426. This prevents the P-link 419 from creating a connection between the buried P-region 409 and the body region 406. Additionally, it is hard to invert regions A, B, and C and therefore, a P-channel will not form in response to surface charges. This disconnection between the two regions creates a break in the short circuit that would otherwise continue to the edge of the device die. It should be noted that FIG. 4C depicts three separate surface poly regions 426, but only one field plate is necessary to disrupt the short circuit.

Figure 5A:
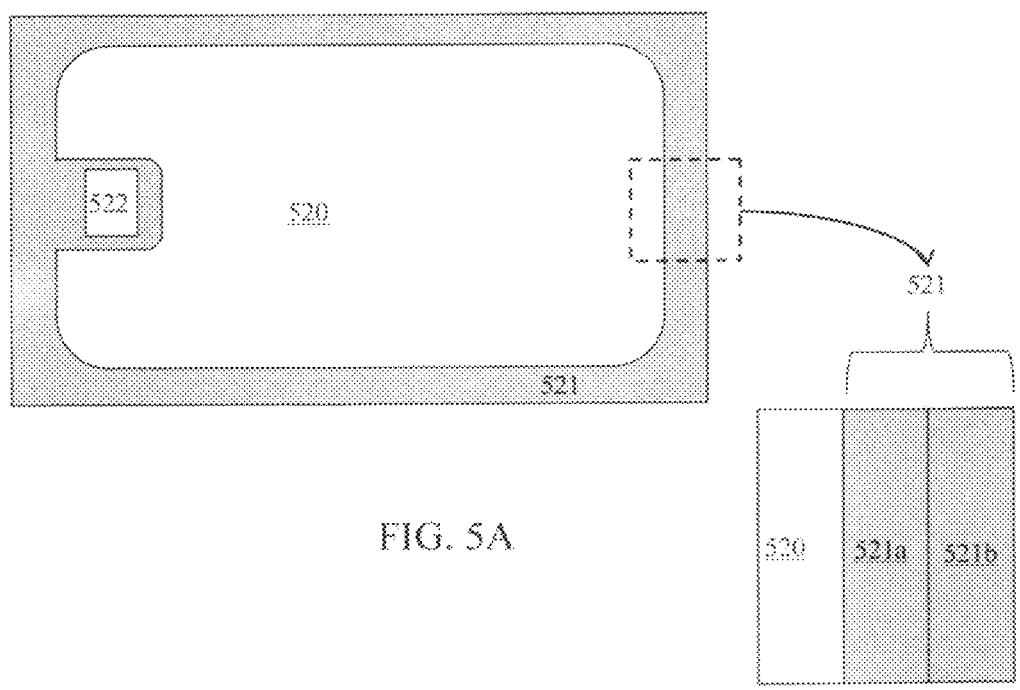
FIG. 5A is a top view of a device die showing the active area and the termination area according to a second embodiment of the present invention.

FIGS. 5A-5B depict a second embodiment wherein only two termination zones are required. By eliminating one of the termination zones, valuable space on the device die can now be used for additional active device structures. The reduction in the number of zones is made possible by the electrical disconnection created between the buried P-regions 509 and the body region 506 as a result of there being no P-links 119 in the termination region 521. When the buried P-regions 509 are connected to the body layer 506 with P-links 119, there is a continuous electrical path. However, without P-links 119 connecting the buried P-regions 509 to the body region 506, the body layer 506 is no longer continuous because the shield electrodes 511 interrupt the body layer. Therefore, according to this embodiment the body layer 506 is unable to create a short circuit to the edge of the device and there is no need for floating field plates or a third termination zone. This is an example of a situation where the functions of the second and third zones are combined into the structure of a single zone.

The second embodiment includes a termination structure of a semiconductor transistor device in which not every buried P-region 109 is connected to the body region 106 with a P-link 119. An extra mask layer is required in order to create a semiconductor transistor device with P-links 119 at selected locations. The additional mask layer is used instead of using a blanket implant to create the P-links 119. The method of fabricating this type of semiconductor transistor device is described in further detail in commonly owned U.S. patent application Ser. No. 13/561,523 (attorney reference number ANO-056-US), which was incorporated herein by reference above. This additional masking step is applied for masking off locations in the active cell area 520 that will not have P-links 119, the entire termination region 521 can be masked off to prevent P-links 119 from forming a connection between the buried P-region 509 and the body region 506.

FIG. 5A is a top view of a device die according to the second embodiment. It depicts the gate pad 522 and a termination region 521 formed around an active cell area 520. The active cell area 520 contains a plurality of active FBM devices. The termination region 521 is comprised of two unique zones. The region surrounded by the dotted box is magnified in order to show a clearer view of the termination region 521. The small segment is a representation of the entire outside perimeter of the device die. The first zone 521*a* is proximate to the active cell area and surrounds the entire perimeter of the active cell area 520. The second zone 521*b* is formed immediately outside the first zone 521*a* and surrounds the entire outer perimeter of the first zone 521a. The second zone 521b extends to the edge of the device die. The widths of each zone shown in FIG. 5A are provided as one possible configuration. It should be noted that the designer is free to alter the respective widths of each zone to maximize the properties desired for the device.

FIG. 5B demonstrates how each region alters the electric potential contours 530. In the first termination zone 521a the electric potential contours are mostly prevented from coming to the surface. The buried P-regions 509 prevent most of the potential contours from advancing towards the surface of the device. As discussed above, the electric field is spread over the entire depleted region formed by the buried P-region 509 and as a result the first termination zone 521a is capable of spreading the electric field. It should be noted that the buried P-region 509 is disconnected from the body region throughout the entire termination zone 521.

Figure 6A:
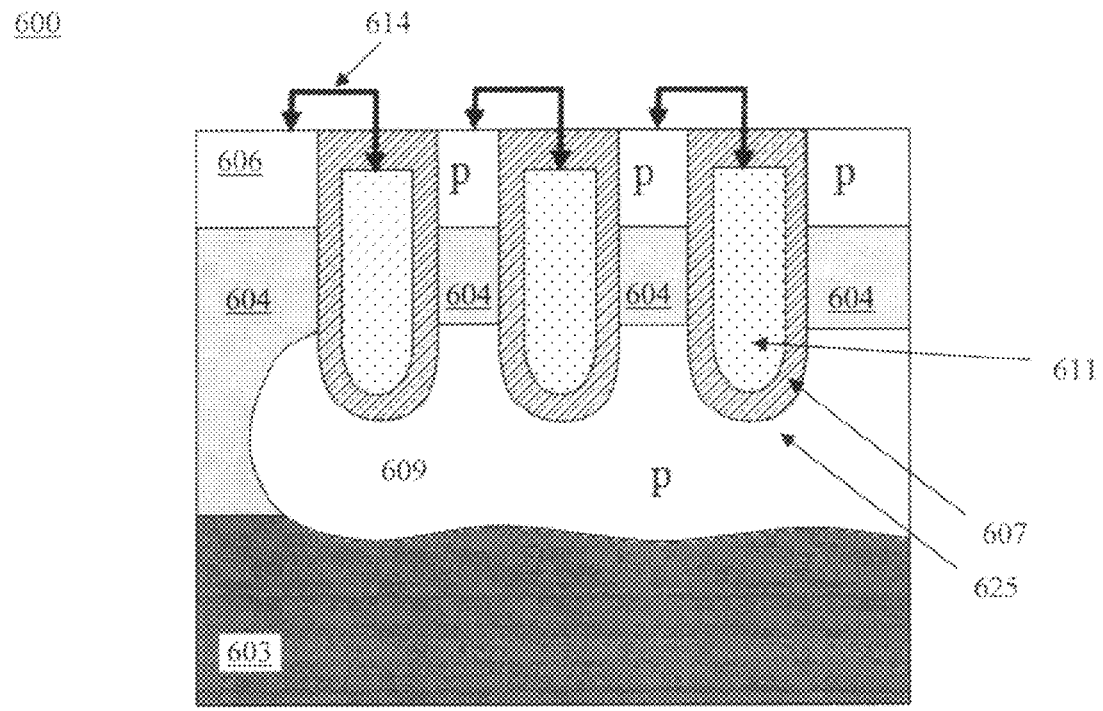
FIGS. 6A-6B are cross sectional views of the two different termination zones within the termination region according to a second embodiment of the present invention.

FIG. 6A is a cross section of the termination structures 600 in the first termination zone 521a. The first termination zone 521a is designed such that near the edge of the active cell area 520 the electric field is spread rapidly. Similar to the active device, the termination device structures 600 within the first termination zone 521a are formed on a suitably doped (e.g., N-type) semiconductor substrate (not shown). Above the substrate, a voltage blocking region 603 is formed. It should be noted that only the top portion of the voltage blocking region 603 is depicted in FIG. 6A. Above the voltage blocking region 603 is a surface shielded region 604. Both layers are suitably doped (e.g., N-type), but the doping density of the surface shielded layer 604 is on the order of 5 to 100 times greater. By way of example and not by way of limitation, the voltage blocking region 603 may have a doping concentration of about 1e14 $cm^3$ to 5e15 $cm^3$, and the surface shielded region 604 may have a doping concentration of about 1e15 $cm^3$ to 5e16 $cm^3$. These layers are formed at the same time the corresponding layers in the active cell area are formed and therefore require no additional processing steps.

The termination device structures 600 also include trenches 625 extending down through the surface shielded region 604. However, it should be noted that the depth of the shield trench is variable and can also extend into the voltage blocking region 603 in some embodiments. The trench is lined with a suitable dielectric material 607. By way of example and not by way of limitation the dielectric material may be a thermal oxide or a deposited oxide. The trenches 625 are filled with a conductive material to form a shield electrode 611. By way of example and not by way of limitation, the shield electrode may be formed with polysilicon. The shield trench and electrodes for the termination device structures may be formed during the same processing steps that are used to form the active device shield trenches and shield electrodes and therefore require no additional processing steps. Proximate to the shield electrode 611, at the top surface of the surface shielded region 604, a suitably doped (e.g., P-doped) body layer 606 is formed. The body region 606 extends from the shield electrode 611 and continues until it reaches the next trench.

In order to quickly spread the electric field, an electrical connection 614 connects the shield electrode 611 to a portion of the body region 606 to its left. As shown in FIG. 6A, the body region 606 to the left of a shield electrode 611 is closer to the active region. By way of example and not by way of limitation, the connection between the shield electrode 611 and the body region 606 may be made with a conductive material such as aluminum. The spreading of the electric field is also achieved through the use of buried P-doped regions 609. Buried P-regions 609 are formed below each shield electrode 611. By way of example and not by way of limitation, the cumulative depth of the trench 625 plus the buried P-region 609 may extend deeper than or substantially the same depth surface shielded region 604. In the context of the type of device shown in FIGS. 6A-6B, the term "substantially the same depth" includes a depth that is within ±10% of the thickness of the surface shielded region. Forming the buried P-region 609 below the surface of the device provides an advantage over traditional JTE type termination structures. Without surface interactions, the buried P-region 609 will yield a higher overall BV, and the BV will not be diminished by surface charge variations across the device.

In an exemplary embodiment the buried P-region 609 may be formed through ion implantation. The P-type dopants are implanted at the bottom of the shield trench before the dielectric material 607 and shield electrode 611 are formed in the trench. The buried P-regions 609 below each trench may become connected to the adjacent buried P-regions 609. Additionally, the body region 606 nearest the active cell area 520 is connected to the body region 606 within the active cell area 520.

In an exemplary embodiment a semiconductor device having an active cell area and a termination region, may be formed as follows. An epitaxial layer of a first conductivity type may be formed on a top surface of a semiconductor substrate of the first conductivity type. The epitaxial layer includes a surface shielded region that is heavily doped positioned above a voltage blocking region that is lightly doped. A plurality of trenches is formed in the epitaxial layer. The plurality of trenches includes a first subset of trenches corresponding to a plurality of active cell devices in an active cell area and a second subset of trenches corresponding to a plurality of termination structures in a termination region surrounding the active cell area. Dopants of a second conductivity type opposite the first are implanted into bottoms of the second subset of trenches to form buried doped regions. Each buried doped region is positioned below one of plurality of trenches, and extends to a depth substantially the same as the bottom surface of the surface shielded region. Sidewalls of the trenches are then lined with an insulator, such as an oxide. Remaining portions of the trenches are filled with a conductive material to form trench shield electrodes. Dopants of the second conductivity type are implanted into the epitaxial layer to form body regions proximate the trenches. Dopants of the first conductivity type may be implanted into the body regions to form source regions proximate trenches corresponding to active devices in the active cell area. The termination region may be masked during this stage to prevent forming source regions in the termination structures.

The gate electrodes may be formed in the active cell area between adjacent trenches disposed near the top surface of the surface shielded region. Electrical connections may be formed to the shield electrodes of the termination structures. Each termination structure in a first zone closest to the active cell area includes an electrical connection between its trench shield electrode and a portion of the body layer closer to the active cell area. Each termination structure in a second zone includes an electrical connection between its trench shield electrode and a portion of the body layer further away from the active cell area. As noted above, a spacing between each termination structure in the second zone increases with increasing distance away from the active cell area.

Once the electric field has been spread it must then be brought back to the surface quickly and in a uniform manner. FIG. 5B shows that the electric field is allowed to move back to the surface by allowing the potential contours 530 to form in between the vertical walls of the shield electrodes 511.

Figure 6B:
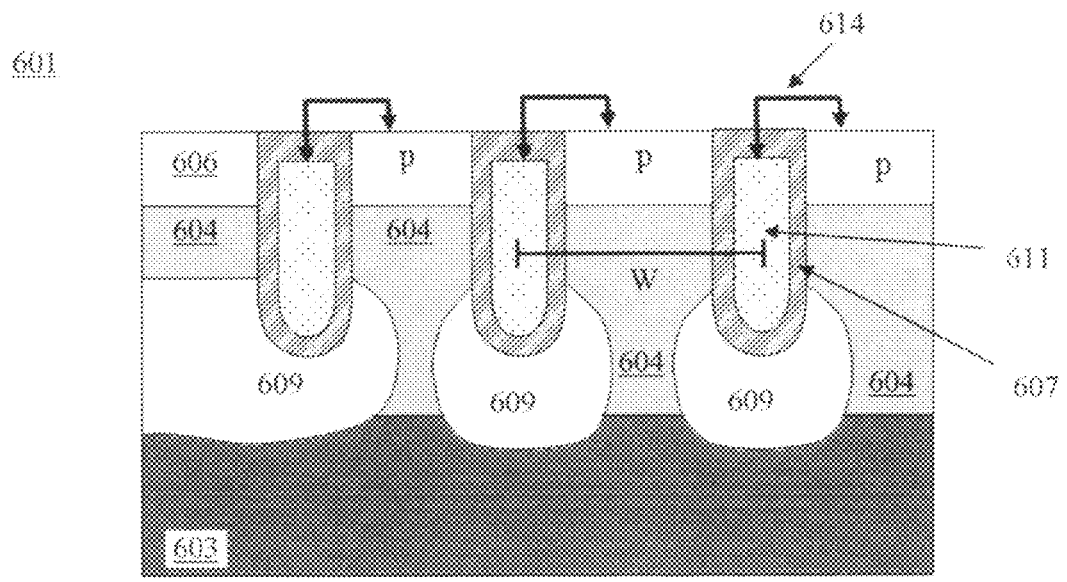

FIG. 6B depicts the termination structures 601 in the second termination zone 521b. The termination structures in the second zone 601 are formed in a similar manner to those in the first termination zone 521a. In the present embodiment there are only two differences. First, the shield electrode 611 is electrically connected to the body layer 606 immediately following the shield electrode 611. As shown in FIG. 6B, the body layer 606 immediately following the shield electrode 611 is the one immediately to the right of the trench and further away from the active area. Second, the spacing between the trenches W increases as the distance between the structures' 601 and the active cell area increases.

According to above descriptions of these different embodiments the termination structure includes three different zones. The first zone is configured to spread the electric field within the device. The second zone is configured to smoothly bring the electric field back up to the top surface of the device. The third zone is configured to prevent the body layer from shorting to the edge of the device die. It is noted that in some embodiments, the functions of two or more of these zones may be combined into a feature that can be implemented structurally as a single zone.

Each zone includes a first semiconductor layer, e.g., a semiconductor substrate, of a first conductivity type. A second semiconductor layer, e.g., an epitaxial layer, of the first conductivity type is located on top of the substrate. The epitaxial layer is divided into a surface shielded region and a voltage blocking region. The surface shielded region is highly doped and the voltage blocking region is lightly doped with respect to the surface shielded region. The zones each contain one or more structures comprising a deep trench lined with an oxide and filled with a conductive material with a buried doped-region of the second conductivity type at its bottom. In an embodiment, each of the buried-doped regions connects to the body region. As used throughout the rest of this description, the first conductivity type will be N-type and the second conductivity type will be P-type. One skilled in the art will recognize that the doping types may be reversed in accordance without departing from the scope of embodiments of the present invention.

In the first termination zone, insulated shield electrodes fill each trench and are electrically connected to a portion of the body layer closer to the active cell area. Within the second zone, insulated shield electrodes fill each trench and are electrically connected to a portion of the body region further away from the active cell area. The spacing between the trenches of the second region increases as the distance from the active cell area increases. This allows for the electric field to be smoothly brought back up to the top surface of the device. Within the third zone, the device structures have floating field plates that interrupt the body region in order to create a channel stop.

Another embodiment as shown is directed to a termination structure for a FBM device which requires only two zones. The first zone is configured to spread the electric field within the device. The second zone is configured to smoothly bring the electric field back up to the top surface of the device. According to this embodiment a third zone is not required because a disconnection between the buried P-region and the body region is incorporated into one of the processing steps required for the fabrication of the FBM device.

In addition, according to this embodiment, both zones include a first semiconductor layer, e.g., a semiconductor substrate, of a first conductivity type. A second semiconductor layer, e.g., an epitaxial layer, of the first conductivity type is located on top of the substrate. The epitaxial layer is divided into a surface shielded region and a voltage blocking region. The surface shielded region is highly doped and the voltage blocking region is lightly doped with respect to the surface shielded region. The zones each contain one or more structures each of which has a deep trench with a buried doped-region of the second conductivity type at its bottom. According to this embodiment, the buried-doped regions are prevented from connecting to the body region.

In the first zone, insulated shield electrodes fill each trench and are electrically connected to a portion of the body layer closer to the active cell area. Within the second zone, insulated shield electrodes fill each trench and are electrically connected to a portion of the body region further away from the active cell area. The spacing between the trenches of the second region increases as the distance from the active cell area increases. This allows for the electric field to be smoothly brought back up to the top surface of the device. In order to prevent a short circuit from forming between the body layer and the edge of the device die, an extra masking step is implemented during the fabrication of the FBM device. The mask is used to create an electrical disconnect between the buried P-regions and the body region. This prevents the device from shorting to the edge of the device die and therefore, the third zone (the channel stop) is no longer required. Though an additional process step is included, the benefit is that space saved by removing the third termination zone can be used for more active cells.

Figure 7A:
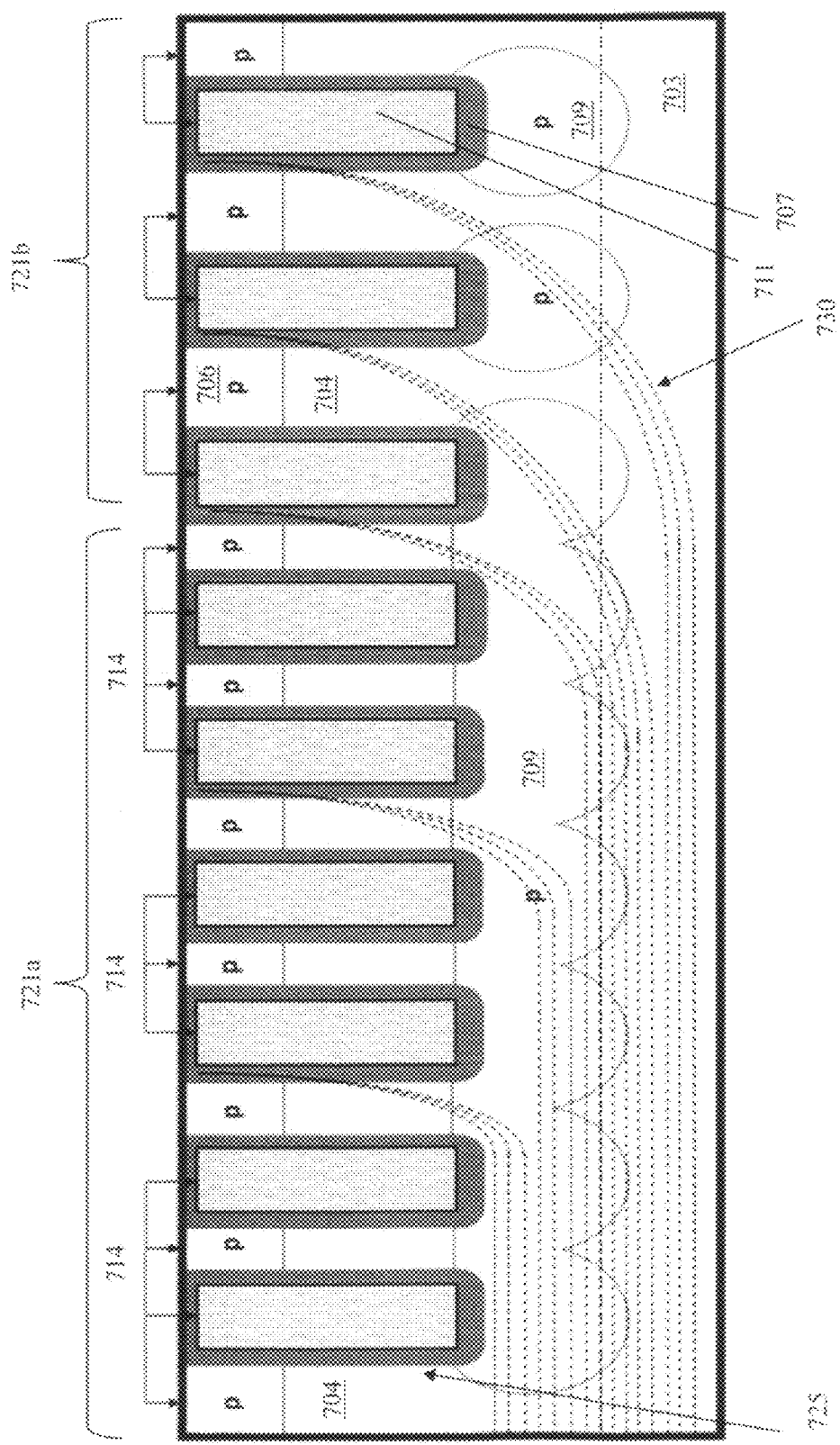
FIG. 7A is a cross section view of an alternate embodiment implemented with metal strapping configuration in the termination area.

One of the limiting factors in the earlier termination designs was the conservative approach taken to the initial JTE region as shown in the first zone in FIG. 6A. The initial trenches are closely spaced so as to merge the buried P-regions. This enables adequate spreading of the electric field away from the active region so as to enable an effective transition of the field to the surface. Unlike a conventional JTE, the P-regions are not heavily doped due to charge balance in the active region. Therefore, the P-regions are partially depleted. Hence the initial number of trenches that are conservatively spaced is slightly high. FIG. 7A shows an embodiment of the present invention comprises a structure that effectively achieves the same purpose but by following a more aggressive approach which further reduces the size of the termination area.

As seen in FIG. 7A, one of the embodiments where two adjacent trenches are bootstrapped with the body region in between. This configuration essentially creates an electric dead zone. Due to the short, the P-regions do not get depleted as much and spread the electric field out. To allow for a smooth transition of the field to the surface, the body region adjacent to the shorted trenches is left floating so as to allow some of the electric field to terminate at the surface. The spacing of this floating body region should be chosen adequately. If it is too wide, convergence of the electric field at this sport increases drastically and creates a hot spot at that region, thus causing breakdown. If it is too close, the surface sees too little electric field. This defeats the purpose of the floating body region and more trenches will be required to dissipate the electric field.

Figure 8A:
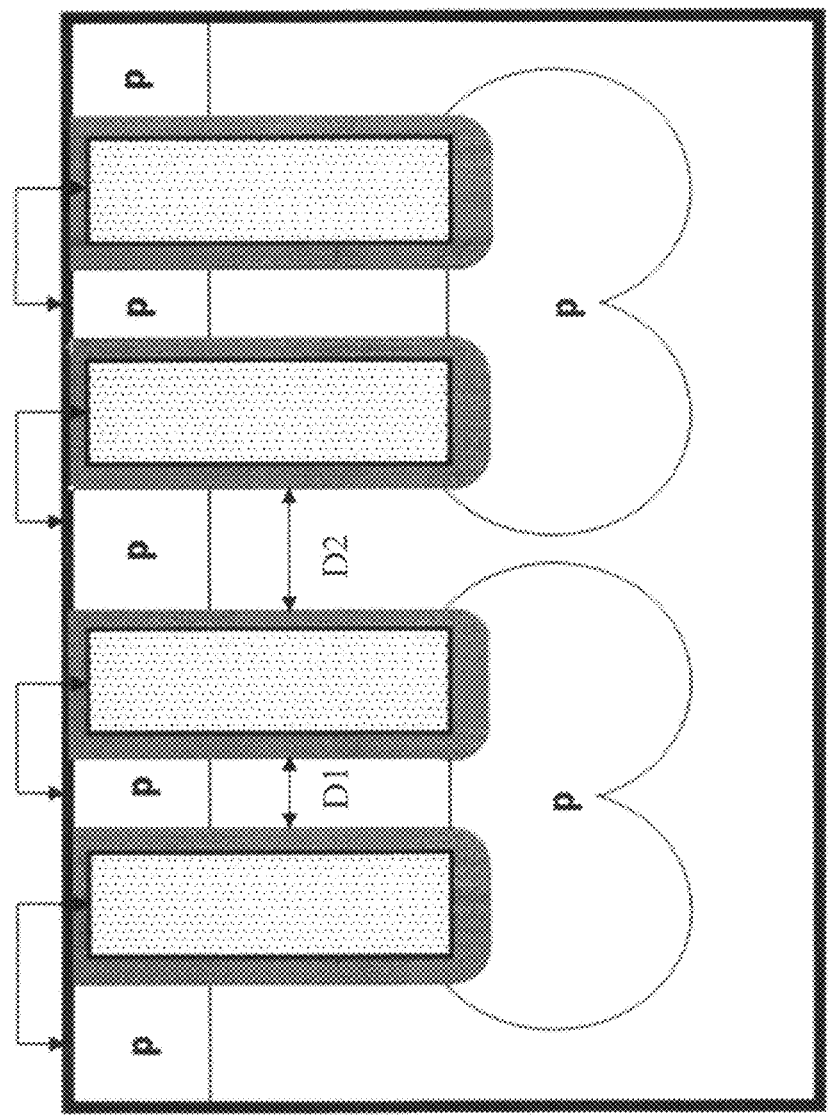
FIG. 8A is a cross section view of the termination structure according to an alternative embodiment of the present invention.
Figure 8B:
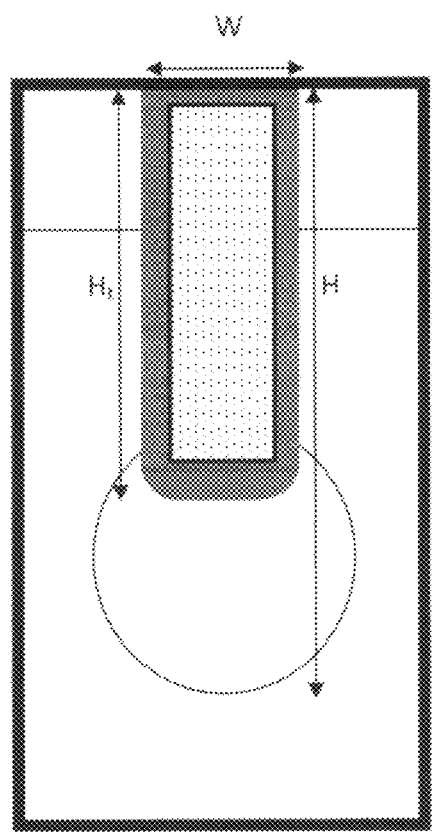
FIG. 8B is a cross section view illustrating a single trench with trench dimensions.

The basic concept behind the bootstrapped structure is to essentially short two adjacent trenches to create one wide trench. One of the common principles behind termination design is the Width/Height (W/H) ratio, as shown in FIG. 8B. For effective termination, a guard ring usually has a W/H>1 which helps in pushing the field out a little more and preventing a hot-spot at the surface. If W/H<1, the density of field lines converging at the surface is pretty high. In the MOSFET structure indicated in this investigation, the presence of the trench and the P-implant under it essentially always creates a very low W/H ratio. So it becomes extremely difficult to spread the electric field effectively. Adding guard rings exclusively for termination purposes increases the mask count and hence, the wafer cost.

Adding a metal plate at the surface shorting the trench to the adjacent body region effectively ties the potential of the two entities. The metal field plate at the surface connected to each trench prevents convergence of the electric field at that location and spreads it out. Shorting the two trenches, as shown in this investigation, virtually increases the W/H ratio, approximating the shorted trenches to a single, wider guard ring. This spreads out the field even more, thus relieving the first zone in the structure of any additional stress due to the electric field.

The bootstrapped structure is repeated at regular intervals throughout the initial portion of the termination. The shorted trenches are alternated with floating body regions so that each dead zone spreads the electric field sufficiently and the floating regions allows for adequate release of the electric field. It should be noted that this approach is required only in the initial half of the termination region. After a while, the electric field is sufficiently spread out and balancing the horizontal and vertical components of the electric field becomes easier. Hence, the structure is configured according to the orientation used in the previous embodiment as shown in zone 601 in FIG. 6B.

This approach essentially allows the electric field to spread in a more distributed manner when compared to the lumped manner shown in the related patent applications filed previously. This way, the electric field can be alternately spread with the shorted trenches and transition of the some of the electric field to the surface using the floating body regions. Hence, creating a metal strapped structure essentially controls the rate of voltage drop across the trenches. This helps in dropping the required drain voltage in the minimum area required. This approach is not necessarily limited to shorting just two trenches. More than two trenches may be shorted to create the dead zone and shape the electric field, as long as the adjacent floating body regions are optimally spaced.

FIG. 7A is a cross sectional view of a preferred embodiment of this invention that further improves the termination structure. Specifically, the termination structures as shown in FIGS. 3A to 6B are limited by a slow rate of voltage reduction over the first termination zone. As shown in FIG. 7A, the termination device structure is formed on a suitably doped (e.g., N-type) semiconductor substrate (not specifically shown) to support a voltage blocking region 703 above the substrate, and a surface shielded region 704 is formed above the voltage blocking region 703. The termination device structure also includes trenches 725 extending down through the surface shielded region 704. However, it should be noted that the depth of the shield trench is variable and can also extend into the voltage blocking region 703 in some embodiments. The trench is lined with a suitable dielectric material 707. The trenches 725 are filled with a conductive material to form a shield electrode 711. By way of example and not by way of limitation, the shield electrode may be formed with polysilicon. Similar as shown in FIG. 5B, in the first zone 721a, the shield electrode 711 is connected to a portion of the body layer 706 to its left through an electrical connection and the buried P-regions 709 are not connected to the body region through a P-link, such as P-link 119. In addition, in this embodiment, in the first termination zone 721a, metal strapping configuration is implemented wherein the metal straps 714 are formed as electrical connectors to short the polysilicon electrodes 711 in two or more adjacent trenches 725. As a result, in the first termination zone 721a, several electrical dead zones are created in the regions between two adjacent shorted trenches with the P-regions 706 in between to achieve better control of the rate of voltage reduction. FIG. 7A shows that in the first termination zone 721a, the electric field is allowed to move back to the surface by allowing the potential contours 730 to form in the region between the vertical walls of the shield electrodes 711 in the non-dead zones, thus achieving a better control of the rate of voltage reduction. The second zone 721b extends to the edge of the device die and is similar as the second zone 521b shown in FIG. 5B.

Figure 7B:
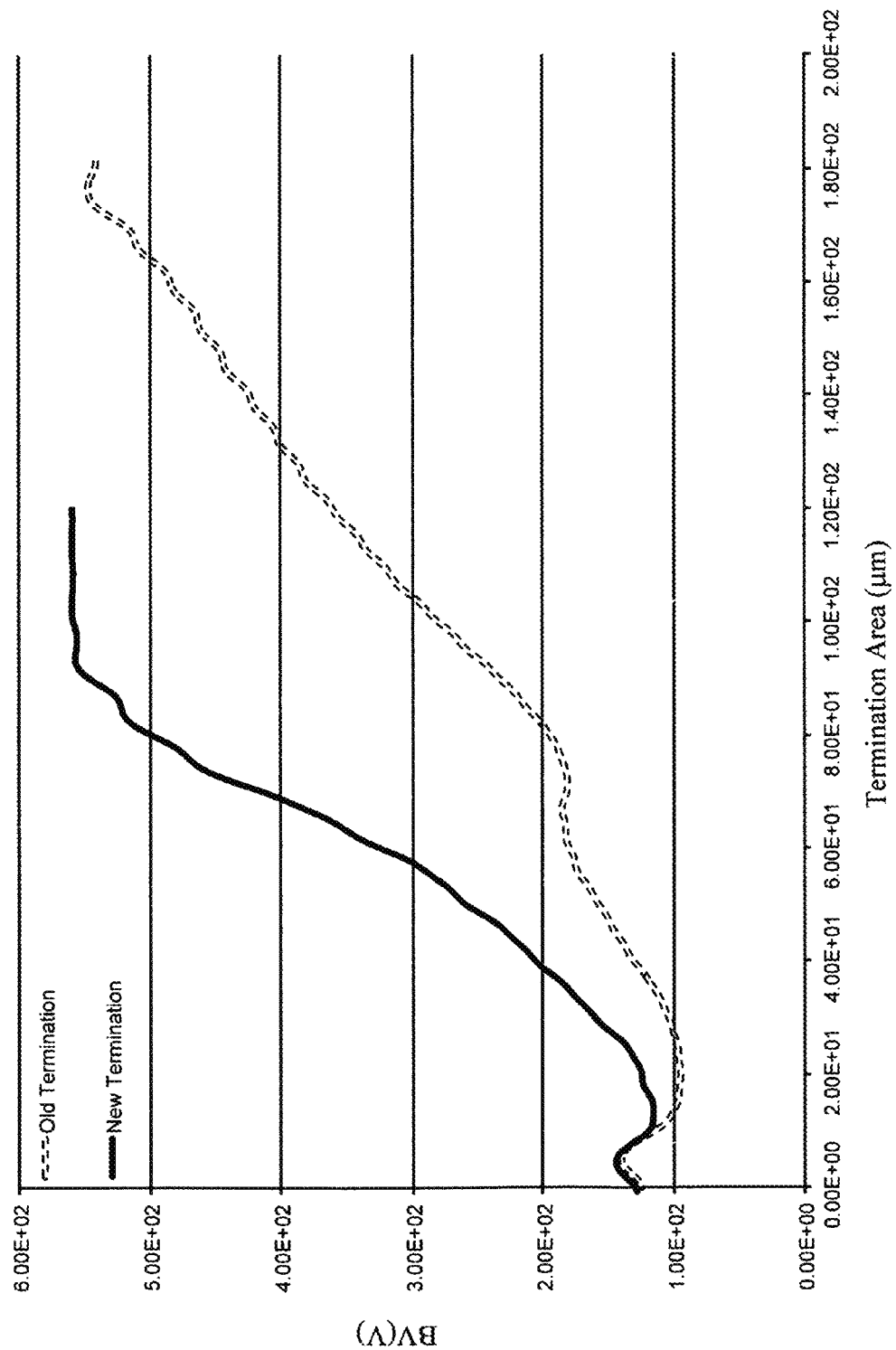
FIG. 7B is a diagram for comparing the rate of voltage reduction in the first termination zone.

FIG. 7B is a diagram for comparing the rates of the electrostatic potential drops in the first terminal zone 721a (new termination line) and the first termination zone 521a (old termination line) along the termination zone starting from the edge of the active cell area at the beginning of the termination area. The greater rate of voltage reduction achieved by the improved termination structure allows a more aggressive voltage control over the first termination zone while maintaining good control over the surface electric field thus avoiding premature breakdown. With a better control of the voltage drop over the first termination zone, allows a much smaller termination area. As shown in FIG. 7B, a 25% to 40% reduction of termination area is achievable without sacrificing the breakdown voltage.

FIG. 7A shows a semiconductor power device formed in a semiconductor substrate of a first conductivity type comprises an active cell area and a termination area surrounding the active cell area and disposed near edges of the semiconductor substrate. The termination area includes first termination zone adjacent to the active cell area having a plurality of trenches filled with v conductivity material and insulated by a dielectric layer along trench sidewalls and covering a trench bottom surface each constitutes a shield electrode wherein the trenches extending vertically through a body region of a second conductivity type near a top surface of the semiconductor substrate and further extending through a surface shield region of the first conductivity type. According to the configuration of FIG. 7A, a distance between at least a first pair of adjacent trenches are smaller than a distance between a second pair of adjacent trenches wherein the first pair of adjacent trenches are electrically shorted to each other and also to the body region between the first pair of adjacent trenches and the second pair of adjacent trenches are each electrically shorted only to the body region of the second conductivity type immediately next to the trench closer to the active area.

Another variation of the above scheme can be implemented by just employing an alternately decreasing and increasing spacing instead of the short. The bootstrap can be mimicked by having a small spacing between the trenches instead to prevent the depletion of the buried P-rings and allow for spreading of the electric field. As shown in FIG. 8A, D1<D2 to essentially replicate the effect of a short.

Another structure disclosed in this invention is an embodiment having different trench critical dimensions in the active cell area and in the termination area of the device. The top portion of the MOSFET has a much lower resistivity because it is the charge balanced portion. Therefore, the top portion of the device generally has less adverse effect to the Rds. Instead, most of the MOSFET Rds is contributed by the drift region of the MOSFET. In order to maintain a high breakdown voltage, the resistivity of the drift region needs to be high. This sometime leads to a higher Rds than desired. And usually deep into a process cycle, it is not possible to change the drift region characteristics. So where there is a need to further reduce the Rds without compromising on the breakdown voltage, it is required to introduce an additional N-implant to the device in order to achieve the purpose of reducing the Rds. However, an additional processing step of performing an N-implant can adversely affect the charge balance in the termination region, thus causing an undesirable occurrence of a premature breakdown.

As shown in FIG. 8B, the trench dimensions are shown as a width, W, and a depth, $H_t$. One approach to balancing out the negative effects additional N-implant on breakdown is to make the trench wider. This effectively reduces the mesa region between trenches, negating the extra N-implant and maintaining charge balance and the breakdown voltage. But widening the trenches in the active region of the die cancels out any Rds benefit from the N-implant and again leads to increased Rds. Therefore, it is not feasible to change the aspect ratio (W/H) of the trench in the active region, as shown in FIG. 8B. Hence, different trench aspect ratios are implemented for the active regions and termination regions. In the active region, the regular trench aspect ratio is maintained for optimum Rds. In the termination region, the aspect ratio is increased to maintain charge balance and prevent premature breakdown of the device. The termination region of the device does not contribute to the Rds of the device as its only purpose is to maintain breakdown voltage. The configuration is therefore perfectly acceptable. Furthermore, the variations of the trench aspect ratio in the active region and in the termination can be applied for all termination configurations shown in FIGS. 3A, 5B, 7A and 8A.

The above-mentioned W/H aspect ratio of the trench shown in FIG. 8B typically ranges from 0.2 to 0.5. For the changed ratio, the height, H, may be kept substantially constant while the width of the trench W is varied depending on the requirements based on the dose and energy of the N-implant.

This approach is not limited to one uniform trench critical dimension in the termination region either. The widths of the trenches may also be flexibly adjusted in the termination region too within reasonable limits. The added advantage to having different trench aspect ratio in the termination region is the advantage of using a constant termination scheme in all the different iterations. If the manufacturing processes were to maintain the same trench aspect ratio in the termination as in the active region even with added N-implants, it is required to vary the spacing between the trenches to maintain charge balance. Instead of the convention methods, this invention discloses a configuration by varying the aspect ratio of the trench. A device of this invention can therefore maintain charge balance without reducing the spacing between the trenches. This leads to reduced costs and also reduced complexity during fabrication, and allows the manufacturing processes to use one standard termination scheme for different design iterations of the MOSTFET and various power devices. It is to be further noted that the embodiments presented in this invention become all the more critical given the shift towards Superjunction type device structures which seek to reduce the Rds while maintaining the breakdown voltage through charge balance. So this method can be applied to similar devices where the presence of a trench decreases the W/H ratio significantly.

Although the present invention has been described in terms of the presently preferred embodiment, it is to be understood that such disclosure is not to be interpreted as limiting. For example, though the conductivity types in the examples above often show an n-channel device, the invention can also be applied to p-channel devices by reversing the polarities of the conductivity types. Various alterations and modifications will no doubt become apparent to those skilled in the art after reading above disclosure. Accordingly, it is intended that the appended claims be interpreted as covering all alterations and modifications as fall within the true spirit and scope of the invention.

We claim:

1. A semiconductor power device formed in a semiconductor substrate comprises an active cell area and a termination area surrounding the active cell area and disposed near an outer edge of the semiconductor substrate wherein:
   the termination area includes at least a first and a second termination zones wherein the first and second termination zones are supported on a voltage blocking layer near a bottom surface of the semiconductor substrate and wherein each of the first and second termination zones further comprises a surface shield region comprising trenches with each of the trenches filled with a shield electrode and each of the trenches is surrounded by a dopant region of around trench sidewalls and below a bottom surface of the trenches as buried dopant regions; and
   a distance between adjacent trenches and the buried dopant regions surrounding and below the trenches are configured differently between the first and the second termination zones.

2. The semiconductor power device of claim 1 wherein:
   the first termination zone is adjacent to the active cell area and the distance between the adjacent trenches in the first termination is shorter than the distance between adjacent trenches in the second termination zone.

3. The semiconductor power device of claim 1 wherein:
   the first termination zone is adjacent to the active cell area and the buried dopant regions below the bottom surface of the trenches in the first termination zone are interconnected and separated in the second termination zone.

4. The semiconductor power device of claim 1 wherein:
   the first termination zone is adjacent to the active cell area is configured as a first narrow strip surrounding the active cell area and the second termination zone is configured as a second narrow strip surrounding the first narrow strip wherein the first and second narrow strips are disposed near the outer edge of the semiconductor substrate.

5. The semiconductor power device of claim 1 wherein:
   the voltage blocking layer near the bottom surface of the semiconductor substrate is a layer of a first conductivity type and the dopant regions around the trench sidewalls and the buried dopant regions are regions of a second conductivity type.

6. The semiconductor power device of claim 1 wherein:
   the shield electrode filled in the trenches is composed of a conductive material and each of the trenches is padded with a dielectric material.

7. The semiconductor power device of claim 1 wherein:
   the shield electrode filled in the trenches is composed of a polysilicon and each of the trenches is padded with a dielectric material.

8. The semiconductor power device of claim 1 wherein:
   the shield electrode filled in the trenches is composed of a polysilicon and each of the trenches is padded with a dielectric material.

9. The semiconductor power device of claim 1 wherein:
   both the surface shield region supported on the voltage blocking layer near a bottom surface of the substrate are of a first conductivity type and surface shield region have a higher dopant concentration than the voltage blocking layer.

10. The semiconductor power device of claim 1 wherein:
each of dopant regions surrounding the trenches in the first termination zone is of the second conductivity type and is connected to a body region of the second conductivity type near a top surface of the semiconductor substrate and wherein each of the shield electrodes further having a conductive connector connected to the body region disposed on a side of the trenches nearer the active cell area.

11. The semiconductor power device of claim 1 wherein:
each of dopant regions surrounding the trenches in the second termination zone is of a second conductivity type and is connected to a body region of the second conductivity type near a top surface of the semiconductor substrate and wherein each of the shield electrodes further having a conductive connector connected to the body region disposed on a side of the trenches farther from the active cell area.

12. The semiconductor power device of claim 1 wherein:
each of dopant regions surrounding the trenches in the first termination zone is of the second conductivity type and is connected to a body region of the second conductivity type near a top surface of the semiconductor substrate and wherein at least one of the shield electrodes further having a conductive connector connected to two body regions disposed on a side of the trenches nearer the active cell area.

13. The semiconductor power device of claim 1 wherein:
the surface shield region is an N type doped region and the dopant regions surrounding the trenches and disposed below the bottom surface of trenches are doped with a P type dopant.

14. The semiconductor power device of claim 1 wherein:
the semiconductor substrate further comprises a heavily doped N bottom layer to function as a drain terminal of the semiconductor power device.

15. The semiconductor power device of claim 1 wherein:
the trenches extending vertically through the surface shield region to a depth in the semiconductor substrate at a distance above the voltage blocking layer.

16. The semiconductor power device of claim 1 further comprising:
a third termination zone further comprises floating polysilicon region disposed on a top surface of the semiconductor substrate to function as a filed plate and a channel stop to disrupt a short circuit of the outer edge of the semiconductor substrate.

17. The semiconductor power device of claim 1 wherein:
the semiconductor substrate further comprises a heavily doped N bottom layer having a doping concentration ranging approximately between 1e19 cm-3 to 1e21 cm-3.

18. The semiconductor power device of claim 1 wherein:
the surface shield region of a first conductivity type is an N type doped region doped with an arsenic dopant and a voltage blocking layer of the first conductivity type below the surface shield region is doped with a phosphorous dopant.

19. The semiconductor power device of claim 1 wherein:
the plurality of trenches are padded with an oxide layer and filled with a polysilicon as the conductive trench filling material.

20. The semiconductor power device of claim 1 wherein:
the buried dopant regions of the second conductivity type below the trenches are P-type dopant regions having a dopant concentration ranging approximately between 1e12 cm-3 to 1e13 cm-3.

* * * * *